United States Patent [19]

Zimmermann et al.

[11] Patent Number: 5,198,069
[45] Date of Patent: Mar. 30, 1993

[54] METHOD FOR FABRICATING BUTTABLE EPITAXIAL INFRARED DETECTOR ARRAYS BY DIMENSIONALLY CONTROLLED CLEAVING OF SINGLE CRYSTAL SUBSTRATES

[75] Inventors: Peter H. Zimmermann, Lexington; Paul A. McDonald, N. Billerica, both of Mass.

[73] Assignee: Loral Infrared & Imaging Systems, Inc., Lexington, Mass.

[21] Appl. No.: 445,030

[22] Filed: Dec. 4, 1989

[51] Int. Cl.⁵ ............................................. B44C 1/22
[52] U.S. Cl. ........................................ 156/600; 156/625
[58] Field of Search ............................... 156/600, 625

[56] References Cited
U.S. PATENT DOCUMENTS
4,498,226  2/1985  Inoue et al. ........................ 29/576 B FOREIGN PATENT DOCUMENTS
59-44874  3/1984  Japan ........................ 437/46

Primary Examiner—Peter A. Nelson
Attorney, Agent, or Firm—Leone & Moffa

[57] ABSTRACT

This invention provides a method for fabricating buttable infrared detector arrays by dimensionally controlled cleaving of a single crystal wafer substrate having well defined cleavage planes. The single crystal wafer substrate is first cleaved along its natural cleavage planes so as to form a plurality of cleavage lines defining rectangular detector array regions. A layer of infrared sensitive material is epitaxially grown on the cleaved single crystal wafer substrate. Infrared detector arrays are fabricated on the layer of infrared sensitive material within the rectangular detector array regions defined by the cleavage lines on the single crystal wafer substrate. The fabricated infrared detector arrays are then separated at the cleavage lines so as to form individual buttable infrared detector arrays.

17 Claims, 3 Drawing Sheets

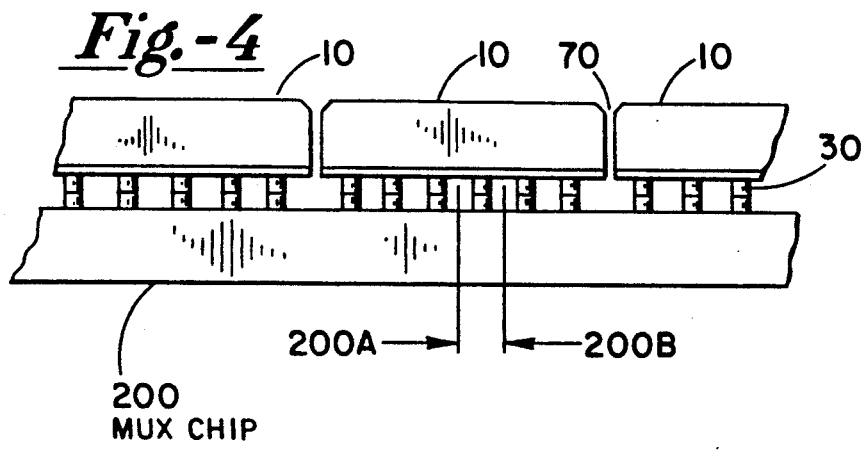
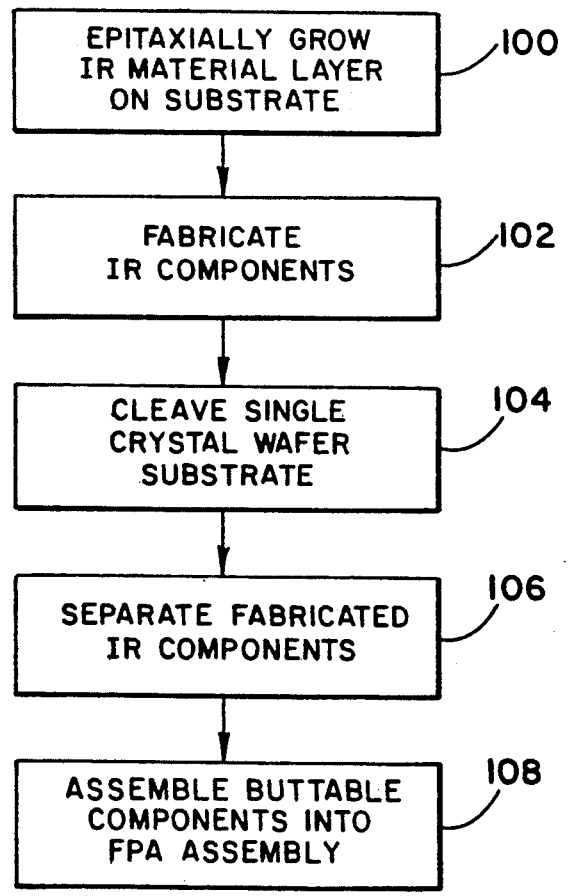

METHOD FOR FABRICATING BUTTABLE EPITAXIAL INFRARED DETECTOR ARRAYS BY DIMENSIONALLY CONTROLLED CLEAVING OF SINGLE CRYSTAL SUBSTRATES

UNITED STATES GOVERNMENT RIGHTS

The United States government has contributed to the design and development of this invention and, thereby, has acquired certain rights in this invention.

FIELD OF THE INVENTION

This invention is directed generally to the fabrication of infrared sensor devices and, more particularly, to a method for fabricating buttable epitaxial infrared detector arrays by dimensionally controlled cleaving of single crystal substrates.

BACKGROUND OF THE INVENTION

In the field of infrared detectors, it is desirable to fabricate infrared detector arrays with tight dimensional control so as to allow the assembly of a multiple number of arrays into a focal plane configuration having a much larger dimension than the individual array dimension. In order to accomplish this end, precision detector array delineation which allows butting of individual detector arrays without any pixel outages at the butting seams, is highly advantageous. To achieve true buttability, the precision and accuracy of detector array delineation must be dimensionally small compared to the size of individual pixels. Typically, pixels are 50 to 100 microns in surface area dimension. Dimensions on this scale require delineation to be achieved to within a few micrometers. It is also highly desirable to develop buttable multiplexer electronics which interconnect with the detector arrays to form large focal plane array assemblies.

Known concepts for buttable multiplexer units, for example, have been proposed by various manufacturers in recent years. Those concepts known to the inventors hereof are commonly referred to as Z-technology concepts and include Grumman Space Systems Division's Z-module concept, Irvine Sensors' HYMOSS concept and Rockwell International's Z-Hy approach. It is believed that none of the aforesaid techniques utilize cleaving of multiplexer electronics or infrared detector arrays to achieve buttability or stackability.

The concept of cleaving has previously been utilized to obtain parallel reflective faces on GaAs semiconductor lasers as described by H.C. Casey, Jr. and M.B. panish in "Heterostructure Lasers", Part B, p.161, A.P. and W.L. Bond, B.G. Cohen, R.C.C. Leite and A. Yariv, Appl. Phys. Lett. 2, 57 (1963). Casey, Jr., et al. describes forming a laser cavity by the use of parallel reflecting surfaces to form a Fabry-Perot interferometer. Such parallel mirrors are readily obtained by cleaving as taught by Bond, et al. As taught by Casey, Jr., et al., GaAs has (110) natural cleavage planes normal to the (100) plane on which epitaxial layers are grown. The wafer with metal contacts can be mounted with wax on a thin flexible metal sheet and small indentations may be scribed near one edge of the wafer with a diamond scriber. Slight flexing will then result in cleavage along (110) planes perpendicular to the surface. Apart from the use in fabricating lasers, neither Casey, Jr. nor Bond, et al. suggest extending the concept of cleaving GaAs for precision delineation of infrared detector arrays on an overlying layer of infrared sensitive material.

SUMMARY OF THE INVENTION

This invention provides a method for fabricating buttable infrared detector arrays by dimensionally controlled cleaving of a single crystal wafer substrate having well defined cleavage planes. A layer of infrared sensitive material is epitaxially grown on the single crystal wafer substrate. Infrared detector arrays are fabricated on the layer of infrared sensitive material on the single crystal wafer substrate. The single crystal wafer substrate is cleaved along its natural cleavage planes so as to form a plurality of cleavage lines defining rectangular detector array regions. The fabricated infrared detector arrays are thusly separated by the cleavage lines so as to form individual buttable infrared detector arrays.

In one embodiment of the invention, the single crystal wafer substrate is comprised of GaAs and the infrared detector array is formed on a layer of mercury cadmium telluride (HgCdTe).

In a further aspect of the invention, multiplexer electronics are fabricated on a GaAs substrate which is cleaved to provide individual buttable multiplexer circuits.

It is a primary object of the invention to provide a method for the fabrication of large mosaic focal planes comprised of a number of smaller four sided buttable individual infrared detector arrays without pixel loss at the butt joint between individual arrays.

It is yet another object of this invention to provide a method for fabricating a detector array which can be joined with other identical buttable detector arrays abutting onto opposing sides with seams along the scan direction to provide focal plane assemblies much longer than individual array lengths.

It is yet another object of the invention to provide a multiplexer made from the same or different cleavable semiconductor material in a buttable configuration.

It is yet another object of the invention to provide a method for fabricating focal plane array assemblies including buttable individual detector arrays as provided by the method of the invention mounted on larger focal plane subunits wherein each subunit accepts many buttable infrared detector arrays.

It is yet another object of the invention to provide a two-side buttable hybrid scanning focal plane array having a plurality of rectangular slabs representing a plurality of N×M detector arrays bonded to an underlying multiplexer and butted at two opposing ends between two other arrays.

Other objects, features and advantages of the invention will become apparent to those skilled in the art through the detailed description, claims and drawings herein wherein like numerals refer to like elements.

BRIEF DESCRIPTION OF THE DRAWINGS

FIG. 4 schematically shows focal plane array assemblies fabricated in accordance with the method of the invention.

FIG. 5 is a flow chart showing the process steps of the method of the invention for fabricating buttable infrared components.

DESCRIPTION OF THE PREFERRED EMBODIMENT

Figure 1:
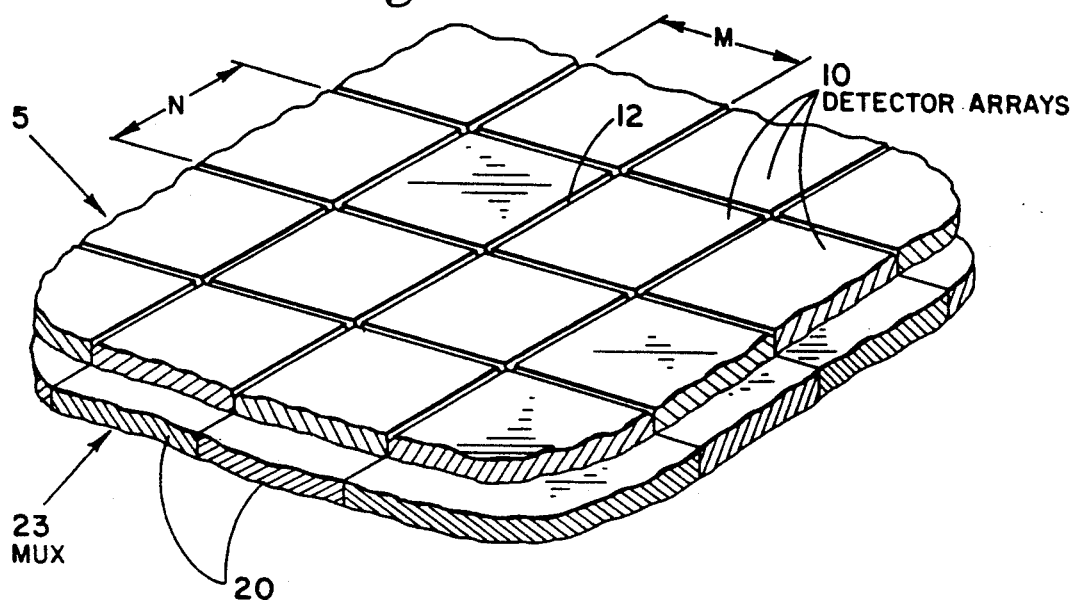
FIG. 1 shows schematically four-side buttable hybrid mosaic focal plane assemblies (FPA) as provided by the method of the invention with no pixel outages at the seams.

Referring now to FIG. 1, a plurality of four-side buttable hybrid mosaic focal plane array assemblies (FPAs) fabricated in accordance with the present invention is shown. The focal plane array assembly is comprised of a plurality of rectangular mosaic detector arrays 10 mounted on a plurality of buttable multiplexer electronics 20. The detector arrays are butted together at seams 12, with no pixel outages at the seams. Each rectangular region 10, on the top layer 5, represents an N×M pixel configuration four-side buttable mosaic detector array which is bonded to a multiplexer chip 20 located in the bottom layer 23. The multiplexer and the mosaic detector arrays are made in accordance with the method of the present invention as detailed further hereinbelow.

N and M could each advantageously represent on of the numbers 64, 128, or 256 and bonding may advantageously be done with indium columns 30 (as shown, for example, in FIG. 3B) mounted in each detector element unit cell 15. The detector arrays and multiplexers are grown or deposited on a single crystal wafer substrate. The substrate is advantageously chosen to be a material having well-defined cleavage planes. The substrate wafers are advantageously oriented such that their cleavage planes are in a direction normal to the wafer plane. An essential feature of this invention is to controllably use substrate wafer cleaving as the final step in shaping the perimeter of the detector array, as explained further below. Thus, the cleaving step is substituted for the more commonly used saw dicing step to cut individual arrays from a wafer.

In one example of this invention, detector arrays made from HgCdTe material are fabricated from HgCdTe grown epitaxially with or without buffer layers on GaAs single crystal wafer substrates oriented in the (100) direction. Such HgCdTe growth is known in the prior art. In accordance with the invention, fabrication of the detector arrays on the entire wafer substrate is completed before using cleavage of the wafer to shape and separate the individual arrays is accomplished.

Because GaAs has natural cleavage planes along the (110) direction, (100) oriented GaAs wafers can be cleaved to achieve rectangular or square shapes for the detector array configuration. Sample cleaves of GaAs wafers indicate that the substrate cleavage lines are straight to within one micrometer per inch or better. Placement can be achieved to within a few micrometers tolerance. Such tolerances are much smaller than a typical detector unit cell, which is about 50 to 100 micrometers, thus facilitating butting of the individual arrays without pixel outage. Considering that the typical HgCdTe/buffer layer combination is only about 20 micrometers thick compared to a typically 50-fold thicker 1 mm GaAs substrate thickness, the detector material will be broken cleanly by the substrate cleave. Alternatively, a narrow HgCdTe strip may be removed by photolithographic means, in conjunction with chemical etching, for example, as shown in FIG. 3D. In the aforesaid case, the limitation on the roughness of the detector array edge would depend on the ability to delineate the HgCdTe or to break the HgCdTe during cleaving of the GaAs substrate.

As will be appreciated by those skilled in the art having the benefit of this disclosure, the invention is not restricted to GaAs single crystal substrates but includes any readily cleavable single crystal substrate. One example of another suitable substrate is CdTe, which also has (110) cleavage planes. For liquid phase epitaxy (LPE) HgCdTe growth, which is normally done on the (111) CdTe face, the cleavage planes are not normal to each other precluding application to staring mosaics, but parallel cleaves are possibly useful for scanning applications.

A multiplexer 20 made from the same or different cleavable semiconductor material could be made in a buttable configuration in the same manner in accordance with the teachings of this invention. Alternatively, as shown in FIG. 4, for example, the multiplexer could be made in larger focal plane subunits 200, each subunit accepting many buttable infrared detector arrays.

Figure 2:
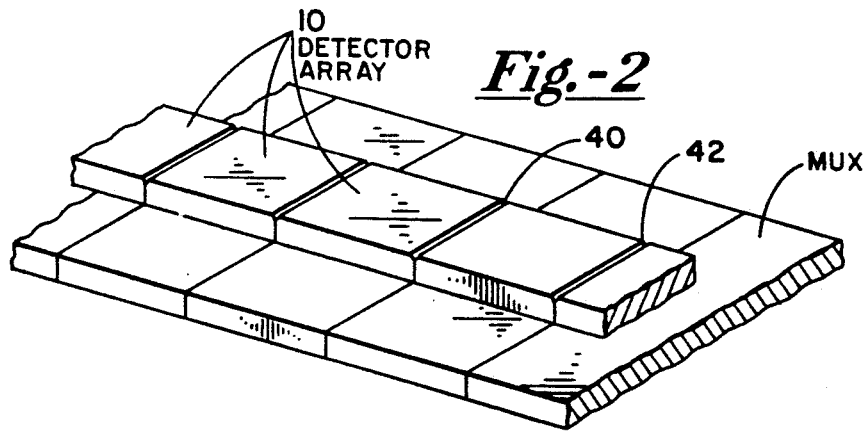
FIG. 2 shows schematically a two-side buttable hybrid scanning focal plane array as provided by another aspect of the method of the invention.

Referring now to FIG. 2, a two-sided buttable hybrid scanning FPA is shown schematically. Each rectangular slab as part of the top assembly 30 represents an N×M detector array 10 bonded to an underlying multiplexer (MUX) and butted at a first side 40 and a second opposing side 42.

Figure 3A:
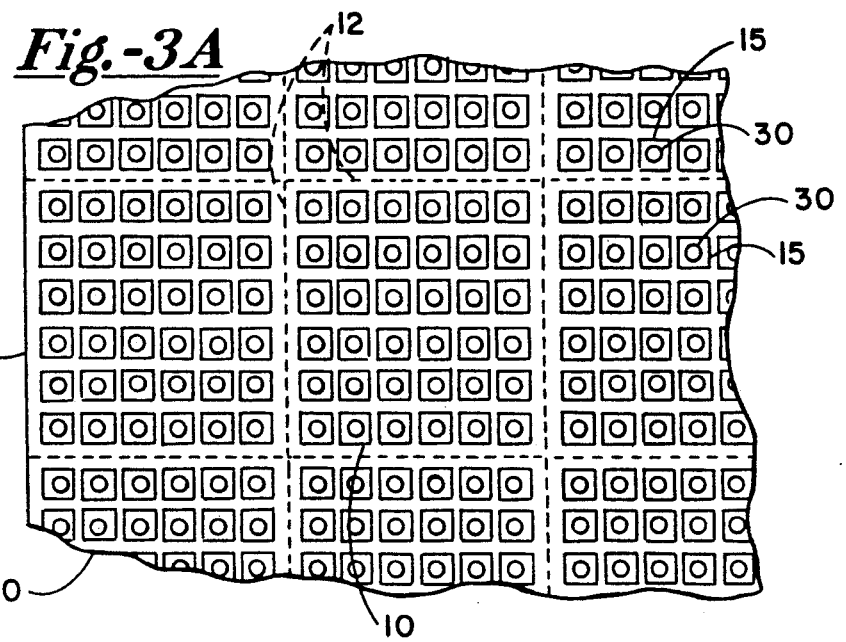
FIG. 3A shows a view of a single crystal substrate wafer after detector array processing completion prior to precision cleaving in accordance with the method of the invention.

Referring now to FIG. 3A, a view of the single crystal substrate wafer 50 as employed in the method of the invention is shown. The wafer is shown at a point in the process after detector array processing is completed but prior to precision cleaving of the substrate. The small dots 30 represent indium columns in each pixel 15 for interconnection to multiplexer assembly. The straight solid lines 12 indicate the precision cleave delineation sites used to separate individual detector arrays from the wafer. An edge wafer cleave 55 prepared in a well known manner prior to detector array photoprocessing is used to align array orientation with respect to cleave direction. Those arrays expected to have a good pixel yield will be selected according to screening criteria for assembly into larger FPA units.

Figure 3B:
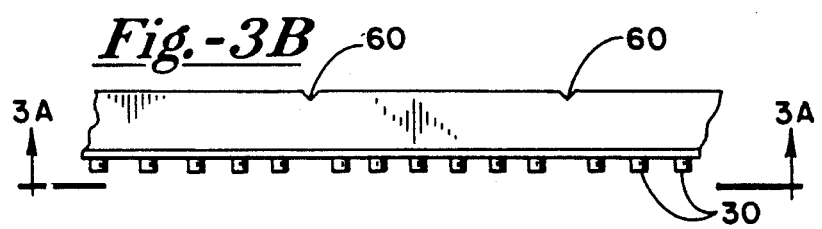
FIG. 3B is a detailed cross section showing HgCdTe arrays before cleaving in accordance with one method of the invention.
Figure 3C:
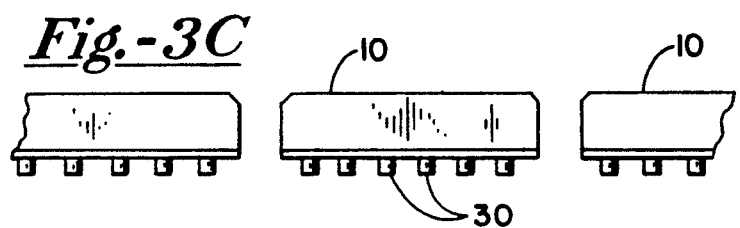
FIG. 3C is a detailed cross-section showing HgCdTe arrays cleaved in accordance with one method of the invention.
Figure 3D:
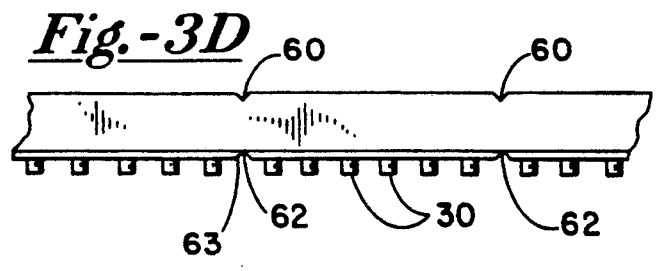
FIG. 3D is a detailed cross section showing HgCdTe arrays before cleaving in accordance with an alternate method of the invention.
Figure 3E:
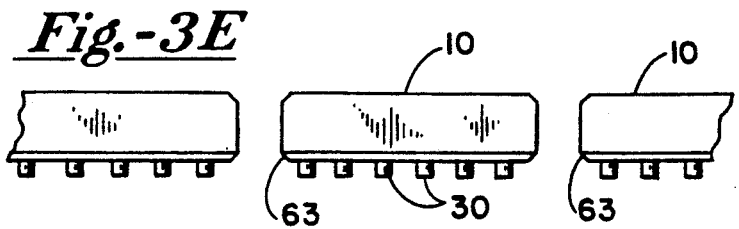
FIG. 3E is a detailed cross section showing HgCdTe arrays cleaved in accordance with an alternate method of the invention.

Now referring to FIG. 3B, a magnified view of a cross section of HgCdTe arrays from FIG. 3A is shown. FIG. 3B shows the cross section of HgCdTe arrays before cleaving of the GaAs substrate in accordance with one method of the invention. A groove 60 parallel to the cleave line is etched through the HgCdTe for purposes of HgCdTe delineation. Such etching is done in accordance with well-known techniques. In FIG. 3B another cleave 60 is shown wherein the HgCdTe simply breaks away during the cleave into arrays 10 as shown in FIG. 3C.

Cleaves may also be initiated by their resulting groove or by groove 62, as shown in FIG. 3D, made on the bottom side of the substrate, or even by making mechanical scribe marks. As shown in FIG. 3C, material breaks away into arrays 10 exhibiting edge 63 at an angle caused by the delineation of the bottom side of the array. The protrusions 30, may be, for example indium columns for interconnection and bonding to a multiplexer configuration.

Referring now to FIG. 4, a cross section of a butt joint 70 between two detector arrays fabricated in accordance with the method of the invention is shown after the arrays 10 are bonded to a multiplexer configuration 200. The multiplexer chip 200 may be fabricated in accordance with the method of the invention. It may also be fabricated in accordance with conventional means. In some applications, it may be advantageous to fabricate the multiplexer chip in a large focal plane subunit, a portion of which is shown in FIG. 4. A typical unit cell size is indicated relatively by lines 200A and 200B.

Now referring to FIG. 5, a simplified flow chart of the essential steps comprising the method of the invention is shown. At step 100, a layer of infrared (IR) material is epitaxially grown by well-known techniques or deposited on a single crystal wafer substrate of, for example, GaAs. The IR material layer may comprise infrared sensitive material or a semi-conductor material as used in infrared sensing devices for electronics associated with infrared sensitive photodiodes or the like. Such electronics may include, for example, multiplexer electronic circuitry. Next, in step 102 components are fabricated on the deposited or grown layer. These may include infrared detectors in the form of pixels which may be deposited in a well-known manner, such as by ion bombardment using photolithographic techniques. In the case of fabricating a multiplexer array, well known semiconductor photolithographic techniques are employed. Having fabricated the IR components, the next step 104 in the process is to cleave the single crystal wafer substrate along its natural cleavage planes so as to form a plurality of cleavage lines defining rectangular regions containing the IR components such as the infrared detectors and multiplexer electronics. After cleaving is completed, at step 106, the IR components are separated along the cleavage lines into individual, buttable infrared components such as buttable detector arrays or multiplexer chips in accordance with the teachings of the invention. Finally, at step 108, the individual components may be assembled into focal plane array assemblies through bump bonding of multiplexer chips to detector arrays according to well-known bump bonding techniques such as through the use of indium columns and pads, for example.

This invention has been described herein in considerable detail in order to comply with the Patent Statutes and to provide those skilled in the art with the information needed to apply the novel principles and to construct and use such specialized components as are required. However, it is to be understood that the invention can be carried out by specifically different equipment and devices, and that various modifications, both as to the equipment details and operating procedures, can be accomplished without departing from the scope of the invention itself.

What is claimed is:

1. A method for fabricating buttable infrared detector arrays by dimensionally controlled cleaving of a single crystal wafer substrate having well defined cleavage planes comprising the steps of:
   (a) epitaxially growing a layer of infrared sensitive material on the single crystal wafer substrate;
   (b) fabricating infrared detector arrays on the layer of infrared sensitive material;
   (c) cleaving the single crystal wafer substrate along its natural cleavage planes so as to form a plurality of cleavage lines defining rectangular detector array regions; and
   (d) separating the fabricated infrared detector arrays at the cleavage lines so as to form individual buttable infrared detector arrays.

2. The method according to claim 1 wherein the layer of infrared sensitive material comprises material from the group consisting of HgCdTe and CdTe.

3. The method of claim 1 wherein the single crystal wafer substrate comprises GaAs.

4. The method of claim 2 wherein the single crystal wafer substrate comprises GaAs.

5. The method of claim 3 wherein the infrared sensitive material comprises material selected from the group consisting of HgCdTe and CdTe.

6. The method of claim 1 wherein the single crystal wafer substrate has a bottom surface, further including the step of making a delineation groove on the bottom surface directly opposing the cleavage lines in order to separate the fabricated infrared detector arrays at the cleavage lines.

7. A method for fabricating buttable infrared components by dimensionally controlling cleaving of a single crystal wafer substrate having well-defined cleavage planes comprising steps of
   (a) depositing a layer of a second material on the substrate;
   (b) fabricating a plurality of infrared components on the second material layer;
   (c) cleaving the single crystal wafer substrate along its natural cleavage plane so as to form a plurality of cleavage lines defining rectangular regions which define the boundaries of each individual infrared component; and
   (d) separating the fabricated infrared components at the cleavage lines so as to form individual buttable infrared components.

8. A method for fabricating buttable multiplexer circuitry for use in infrared sensor devices by dimensionally controlled cleaving of a single crystal wafer substrate having well defined cleavage planes comprising the steps of:
   (a) epitaxially growing a layer of semiconductor material on the substrate;
   (b) fabricating multiplexer electronics on the semiconductor layer;
   (c) cleaving the single crystal wafer substrate along its natural cleavage planes so as to form a plurality of cleavage lines defining rectangular multiplexer regions; and
   (d) separating the fabricated multiplexer electronic circuits at the cleavage lines so as to form individual buttable multiplexer circuits.

9. The method of claim 8 wherein the single crystal wafer substrate is GaAs.

10. The method of claim 9 wherein the layer of semiconductor material comprises GaAs and the second layer is integral with the substrate.

11. The method of claim 8 wherein the single crystal wafer substrate has a bottom surface whereon a plurality of delineation grooves are made in opposition to the cleavage lines so as to facilitate separating the fabricated multiplexer electronic circuits at the cleavage lines.

12. A method for fabricating buttable infrared detector arrays by dimensionally controlled cleaving of a single crystal wafer substrate having well defined cleavage planes comprising the steps of:
 (a) epitaxially growing a layer of infrared sensitive material on the single crystal wafer substrate wherein the single crystal wafer substrate is oriented in the (100) direction;
 (b) fabricating infrared detector arrays on the layer of infrared sensitive material;
 (c) cleaving the single crystal wafer substrate along its natural cleavage planes along the (110) direction so as to form a plurality of cleavage lines defining rectangular detector array regions; and
 (d) separating the fabricated infrared detector arrays at the cleavage lines so as to form individual buttable infrared detector arrays.

13. The method according to claim 12 wherein the layer of infrared sensitive material comprises material from the group consisting of HgCdTe and CdTe.

14. The method of claim 12 wherein the single crystal wafer substrate comprises GaAs.

15. The method of claim 13 wherein the single crystal wafer substrate comprises GaAs.

16. The method of claim 14 wherein the infrared sensitive material comprises material selected from the group consisting of HgCdTe and CdTe.

17. The method of claim 12 wherein the single crystal wafer substrate has a bottom surface, further including the step of making a delineation groove on the bottom surface directly opposing the cleavage lines in order to separate the fabricated infrared detector arrays at the cleavage lines.

* * * * *